(12) United States Patent
Esser et al.

(10) Patent No.: US 6,787,885 B2
(45) Date of Patent: Sep. 7, 2004

(54) LOW TEMPERATURE HYDROPHOBIC DIRECT WAFER BONDING

(75) Inventors: Robert H. Esser, Greenbelt, MD (US); Karl D. Hobart, Uppermarlboro, MD (US); Francis J. Kub, Arnold, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/287,883

(22) Filed: Nov. 4, 2002

(65) Prior Publication Data

US 2004/0084720 A1 May 6, 2004

(51) Int. Cl.$^7$ ................................................ H01L 29/04
(52) U.S. Cl. ........................................ 257/627; 257/618
(58) Field of Search .............................. 257/627, 628, 257/618, 619, 620, 621, 622, 623, 624, 625, 626

(56) References Cited

U.S. PATENT DOCUMENTS

| | | | |
|---|---|---|---|
| 6,010,591 A | * | 1/2000 | Gosele |
| 6,194,290 B1 | | 2/2001 | Kub et al. |
| 2002/0030285 A1 | * | 3/2002 | Sawada et al. |

OTHER PUBLICATIONS

Desmond, Hobart, Kub, Campisi, and Weldon ("Low–temperature atmospheric silicon–silicon wafer bonding for power electronic applications," Electrochemical Society Proceedings, 1998, vol. 97–36, p. 459–465).*

Kub, Hobart, and Desmond ("Electrical characteristics of low temperature direct silicon–silicon bonding for power device applications," Electrochemical Society Proceedings, 1998, vol. 97–36, p. 466–472).*

Hobart, Kub, Dolny, Zafrani, Neilson, Gladish, and McLachlan ("Fabrication of a Double–Side IGBT by Very Low Temperature Wafer Bonding," Proceedings of the 11th International Symposium on Power Semiconducotr Devices and ICs, 1999. ISPSD '9 1999, p. 45–48.*

Esser, Hobart, and Kub, "Improved Low Temperature Hydrophobic Si–Si Bonding Techniques," abstract published on internet prior to Sep. 6, 2001.*

Esser, Hobart, and Kub ("Improved Low Temperature Hydrophobic Si–Si bonding Techniques," presentation to Electrochemica Society Meeting, San Francisco, CA, Sep. 6, 2001).*

Esser, Robert, "Improved Low Temperature Hydrophobic Si–Si Bonding Techniques", Internet, prior to Sep. 6, 2001.

(List continued on next page.)

Primary Examiner—Nathan J. Flynn
Assistant Examiner—Kevin Quinto
(74) Attorney, Agent, or Firm—John J. Karasek; Joseph T. Grunkemeyer

(57) ABSTRACT

A method of making an electronic device comprising the steps of: providing a plurality of wafers, each wafer comprising a bonding surface; etching one or more trenches into one or more bonding surfaces, the trenches substantially perpendicular to a preferred direction of diffusion along one or more of the bonding surfaces; rendering the bonding surfaces hydrophobic; and bonding the bonding surfaces together by direct wafer bonding. A semiconductor structure comprising a plurality of wafers, each wafer comprising a bonding surface, one or more bonding surfaces comprising one or more trenches substantially perpendicular to a preferred direction of diffusion along one or more of the bonding surfaces; and the bonding surfaces bonded together by a direct wafer bonding interface.

10 Claims, 3 Drawing Sheets

OTHER PUBLICATIONS

Esser, Robert, "Improved Low Temperature Hydrophobic Si–Si Bonding Techniques", Electrochemical Society Meeting, San Francisco, CA Sep. 6, 2001.

Hobart, K.D., Fabrication of a Double–Side IGBT by Very Low Temperature Wafer Bonding, IEEE, 1999, pp. 45–48.

Desmond, Cynthia A, "Low–Temperature Atmospheric Silicon–Silicon Wafer Bonding For Power Electronic Applications", Electrochemical Soceity Proceedings, vol. 97–36, pp. 459–465.

Fritz, J, "Electrical Characteristics of Low Temperature Direct Silicon–Silicon Bonding For Power Device Applications", Electrochemical Society Proceedings, vol. 97–36, pp. 466–472.

Esser, Robert, "Directional Diffusion and Void Formation at a Si (001) bonded wafer interface", Journal of Applied Physics, Aug. 15, 2002, pp. 1945–1949, vol. 92 No. 4.

* cited by examiner

LOW TEMPERATURE HYDROPHOBIC DIRECT WAFER BONDING

BACKGROUND OF THE INVENTION

1. Field of the Invention

The invention relates generally to the field of direct wafer bonding.

2. Description of the Prior Art

Hydrophobic wafer bonding is a method of joining two silicon wafers together, preferably with an electrically transparent junction. The wafers are pressed together without an adhesive. This is an efficient method of building device structures that make use of conduction through the bond interface. Among the possibilities for the use of hydrophobic wafer bonding is fabricating full wafer devices such as silicon controlled rectifiers (SCR) and thyristors. The more advanced device designs utilize hydrophobic bonding of processed wafers in order to produce devices with features on both sides. This eliminates the difficulties of processing both sides of a single wafer. Hydrophobic wafer bonding has been proposed and proven as a method of fabrication of double-sided double-gate insulated gate bipolar transistors (DIGBT). The DIGBT structure has been proven to both lower the switching time and losses in power device applications over a traditional IGBT structure.

A primary concern with wafer bonding is voids at the bond interface. There are two primary categories of interfacial voids: extrinsic and intrinsic. Extrinsic voids appear immediately after bonding and are the result of particles, surface imperfections, or air trapped at the interface. Intrinsic bubbles are thermally generated and form after annealing the bonded wafers. Particulate contamination related voids are a factor of the cleanliness of the processing facility. The contamination related voids are eliminated by careful processing and cleanliness procedures and stringent water filtration systems. Analysis of the gases in thermally generated voids indicates the presence of water, nitrogen, hydrocarbons, and hydrofluoric acid. The main constituent, however, is hydrogen from the hydrophobic hydrogen-terminated silicon. Monohydrides have been shown to desorb at 447° C., while dihydrides will desorb at 367° C. The most common way to eliminate the thermally generated voids is to anneal the bonded wafers at high temperatures (800–1000° C.). The high-temperature anneal allows the gases to diffuse into the bulk of the bonded wafers.

With whole wafer device structures such as the thyristor, annealing the bonded wafers at high temperature may be possible, however, if either of the wafers has device processing on it, there may be a strict thermal budget that will not allow annealing over approximately 450° C. depending on the metallization used.

Hydrophilic bonding is not an acceptable method when an electrically transparent junction is needed. Hydrophilic bonding leaves native oxide on the surfaces of the wafers. This native oxide affects the electrical properties of the junction between the wafers. On the other hand, hydrophobic bonding removes the native oxide, allowing for the possibility of an electrically transparent junction.

Kub et al., U.S. Pat. Nos. 6,194,290; 6,153,495; and 6,274,892, incorporated herein by reference, disclose a method of hydrophobic direct wafer bonding comprising the steps of processing two semiconductor substrates, bonding the substrates, and annealing the bonded substrates. The annealing is done at a low temperature, such that the processed surface is not damaged. For example, the annealing temperature is below the melting point or the reaction temperature of a metal on the processed surface. Strong bonds can be formed by this method. A disadvantage of this method is that voids form in the bond interface during the annealing step. Although the regions between the voids may be electrically transparent, the voids are non-conducting carrier traps that reduce the breakdown voltage of the interface, so that it is not electrically transparent throughout the entire bonding interface. Generally, as the number of voids increases, the strength of the bond decreases. When the wafers are cut into individual devices, any device that has a void in its bond may be unusable. As the number of voids increases, the yield of usable devices decreases.

There is need for a method of direct wafer bonding of processed wafers that results in an electrically transparent bond interface that is free of voids, and is strong enough to withstand subsequent handling or dicing.

SUMMARY OF THE INVENTION

It is an object of the invention to provide a method of direct wafer bonding that produces a strong, electrically transparent junction.

It is a further object of the invention to provide a method of direct wafer bonding that does not produce voids in the bond interface.

It is a further object of the invention to provide a method of direct wafer bonding that does damage the features of the wafers.

It is a further object of the invention to provide a method of direct wafer bonding that improves yields over prior methods and over double-sided processing.

These and other objects may be accomplished by a method of making an electronic device comprising the steps of: providing a plurality of wafers, each wafer comprising a bonding surface; etching one or more trenches into one or more bonding surfaces, the trenches substantially perpendicular to a preferred direction of diffusion along one or more of the bonding surfaces; rendering the bonding surfaces hydrophobic; and bonding the bonding surfaces together by direct wafer bonding.

The invention further comprises a semiconductor structure comprising a plurality of wafers, each wafer comprising a bonding surface, one or more bonding surfaces comprising one or more trenches substantially perpendicular to a preferred direction of diffusion along one or more of the bonding surfaces; and the bonding surfaces bonded together by a direct wafer bonding interface.

DETAILED DESCRIPTION OF THE PREFERRED EMBODIMENTS

Figure 1:
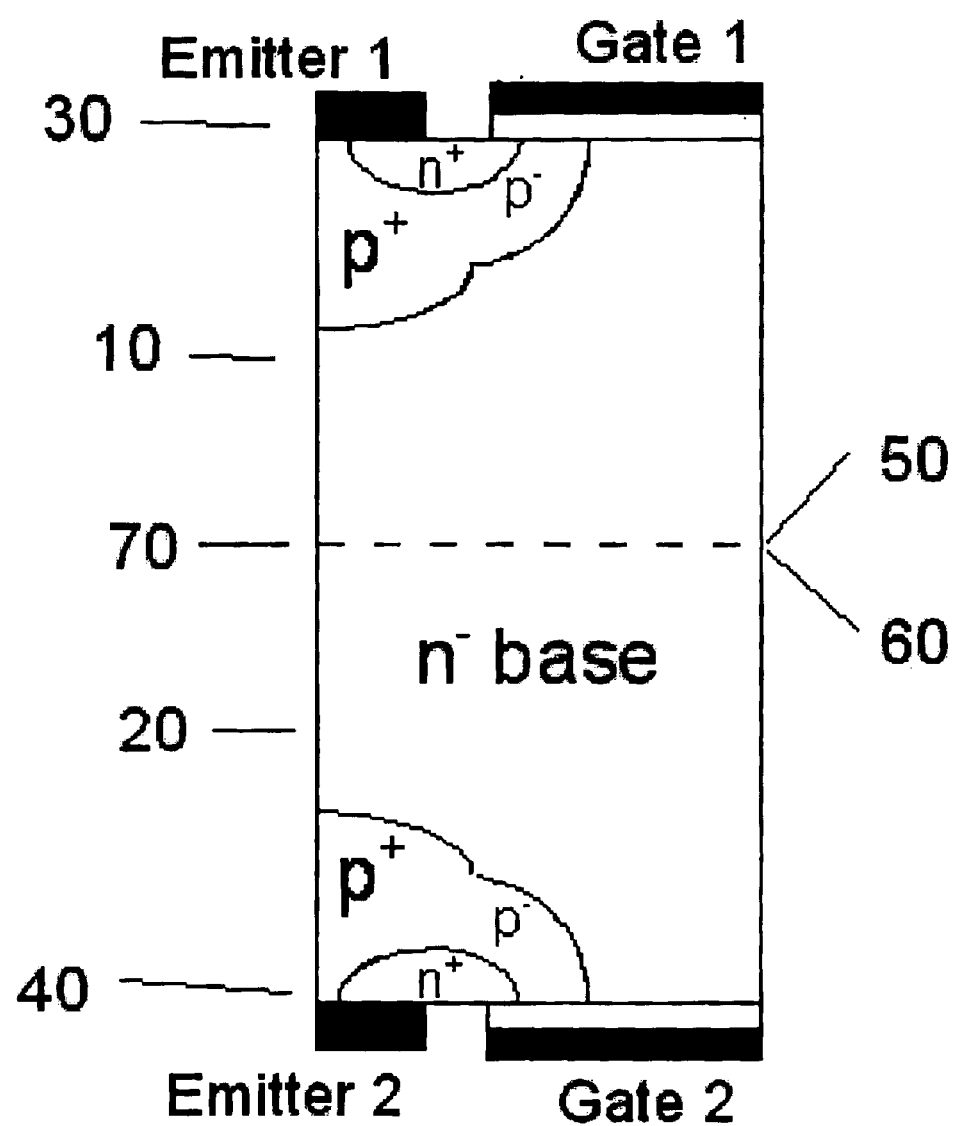
FIG. 1 schematically illustrates an embodiment of a double-sided, double-gate insulated gate bipolar transistor.

The presence of intrinsic voids due to trapped gases can be reduced or eliminated by etching trenches into bonding surface of one or all of the wafers. It is believed that the trenches provide a pathway by which gases can escape from the bond interface. Another way to reduce or eliminate voids is by pre-bond annealing of the wafers. It is believed that the pre-bond annealing drives off residual gases, such as water, hydrogen, and hydrocarbons, that are adsorbed to the wafer surface, so that less gas is released during post-bond annealing. The scope of the claimed processes is not limited to these mechanisms.

The method of the invention comprises a minimum of four steps. Additional steps may also be used when desired. The steps include, but are not limited to, providing a plurality of wafers, etching trenches, cleaning, rendering the bonding surfaces hydrophobic, pre-bond annealing, bonding, post-bond annealing, and dicing.

In the providing step, a plurality of wafers is provided. The wafers can be of any type known in the art. The wafers may be of the same type, or of different types. The wafers can be silicon wafers. Each wafer has two surfaces, by definition. Each wafer comprises a bonding surface. These are the surfaces to be bonded together in a later step. At least one of the wafers may comprise a processed surface opposing the bonding surface of that wafer. In the case of making a double-sided, double-gate insulated gate bipolar transistor, two wafers are used, and both wafers comprise a processed surface. Such transistors are known in the art. Other types of double-sided devices can also be made.

The processed surface can be made by any means known in the art. The processed surface comprises one or more features. The features can be any electrical feature known in the art to be made on a surface of a wafer. Possible features include, but are not limited to, metallizations, regions, implants, thin film depositions or growths, and other electronic device structures. In the case of a double-sided, double-gate insulated gate bipolar transistor, the features include emitters, gates, $n^+$ regions, $p^+$ regions, and $p^-$ regions.

One or more trenches are etched into the bonding surface of at least one of the wafers. The trenches can be etched on the bonding surface by any means known in the art, including wet or dry methods as well as simply cutting the trenches. Plasma etching is a suitable method of etching the trenches. An example of suitable dimensions for the trenches is about 150 $\mu$m wide and about 1 $\mu$m deep. The wafers may also be pre-etched when they are obtained. The trenches may provide a route for gases to vent to the atmosphere instead of being trapped in voids. The trenches may pass between separate circuits to be cut apart. The trenches may extend all the way to the edge of the wafer so that gases can escape.

The spacing and orientation of the trenches may affect the number of voids. Generally, the smaller the spacing between the trenches, the fewer voids will be present. When the trenches are close together, the gases have less distance to diffuse to reach a trench. The orientation is also a factor. The bonding surface may have a preferred direction for diffusion of the gases. When the trenches are etched substantially perpendicular to the preferred diffusion direction, the gases may diffuse directly towards the trenches. Thus the gases reach the trenches and escape faster then they otherwise would. It is not necessary for the trenches to be perfectly perpendicular to the preferred diffusion direction. However, the closer to perpendicular, the shorter the distance the gases may have to diffuse to escape. Whether the alignment is suitable, i.e. substantially perpendicular, can be determined by whether the number of voids is reduced.

For example, on a silicon wafer with a (100) surface, gases may diffuse faster in the <110> directions. This may be due to 2×1 structure that includes troughs along the <110> directions. As there are two perpendicular <110> directions, a trench can be perpendicular to one direction and parallel to the other. A rectangular grid of trenches substantially parallel to the <110> directions is a suitable pattern of trenches. This pattern allows gases diffusing in either preferred direction to diffuse toward a trench and escape.

The bonding surfaces may be cleaned. A purpose of the cleaning step is to remove contaminants from the bonding surfaces. Contaminants are another source of voids in the bond interface. The cleaning step is not a required step of the invention, but may be desirable if the wafers are contaminated. The wafers may also be cleaned even if there is no known contamination. It is common practice in the art to clean wafers regardless of any contamination.

The cleaning can be done by any means known in the art. One method of cleaning comprises placing the wafers in a UV/ozone chamber at 150° C. for 20 minutes, followed by ultrasonic cleaning in SCl ($NH_4OH+H_2O_2+4H_2O$), followed by a rinse in flowing de-ionized water for 10 minutes.

In the rendering step, the bonding surfaces are made hydrophobic. A purpose of this step is to remove native oxide from the bond surface. Native oxide can result in a junction that is not electrically transparent. The rendering may be done by any method known in the art for rendering a wafer surface hydrophobic. One method is to dip the wafer in dilute (1:10) hydrofluoric acid for thirty seconds, followed by spin-drying.

One or more wafers may then be pre-bond annealed. The pre-bond anneal is optional. The pre-bond annealing of each wafer is done at a pre-bond annealing temperature that does not adversely affect the features of any processed surface on that wafer. As used herein, the term "adversely affects" means that the features can no longer exhibit desired electronic properties, or that the features are rendered incapable of performing their intended function. For example, if the features comprise aluminum, the pre-bond annealing temperature may be limited to 450° C., because higher temperatures may cause the aluminum to melt. When the features are limited to doped regions that do not include metal, the pre-bond annealing temperature may be limited to 800° C. Other conditions that may be avoided include, but are not limited to, temperatures that alter the shape of features or devices; that damage passivation layers; that cause diffusion of implants; and that cause diffusion resulting in degradation of device characteristics, parameters, or structures. A suitable pre-bond annealing temperature may be 300° C.

The wafers can all be pre-bond annealed under the same conditions, or they can be pre-bond annealed under different conditions. Different conditions may be desirable when the different wafers have different kinds of features that are sensitive to different temperatures. One wafer may be pre-bond annealed at a temperature that would damage one of the other wafers, as long as the first wafer is not itself damaged.

The pre-bond annealing can be done in an UV/ozone chamber. Pre-bond annealing for longer times may reduce the number of voids, but may also decrease the bond strength. In one experiment it was found that pre-bond annealing for 10 minutes at 300° C. was sufficient to prevent formation of any voids.

In the bonding step, the bonding surfaces are bonded together. The bonding means can be any means known in the art for direct wafer bonding. The bonding can be done in a vacuum and at an elevated temperature. For example, the bonding temperature may range from about 25 to about 250° C.

More than two wafers can be bonded together. For example, two smaller wafers can be bonded to the same bonding surface of one large wafer. Additionally, three or more wafers could be bonded together into a stack. In this case, the interior wafers would each comprise two bonding surfaces.

Post-bond annealing of the wafers is an optional step that may increase the strength of the bond. It is known in the art that typically, a direct bond interface is initially held together by van der Waals forces. Post-bond annealing can strengthen the bond by forming covalent bonds between the wafers. The post-bond annealing is done at a post-bond annealing temperature that does not adversely affect the features of the processed surface. The limit for this temperature is the same as in the pre-bond annealing step. However, since all wafers would be post-bond annealed together, the post-bond annealing temperature must not be high enough to damage any of the processed surfaces. Heating under nitrogen at 400° C. for 16 hours is a suitable post-bond anneal for wafers with aluminum features.

After bonding, the wafers can optionally be diced into separate devices along the same lines as the trenches.

The method of the invention can be used to make a variety of electronic devices. The electronic device can be a double-sided, double-gate insulated gate bipolar transistor. FIG. 1 schematically illustrates an embodiment of a double-sided, double-gate insulated gate bipolar transistor. Each wafer 10, 20 has a processed surface 30, 40 and a bonding surface 50, 60. The bond interface 70 is between the two bonding surfaces 50, 60.

Other devices are also possible and would be readily apparent to those skilled in the art. The electronic device can also be any other device not yet made, but which could be made by direct wafer bonding. These devices would include, but would not be limited to, devices that have features on both sides of a semiconductor substrate.

The invention also comprises a semiconductor structure comprising a plurality of wafers. Each wafer comprises a bonding surface. One or more bonding surfaces comprise trenches as described above. One or more trenches may be substantially perpendicular to a preferred direction of diffusion along the bonding surface. The bonding surfaces are bonded together by a direct wafer bonding interface.

At least one wafer may comprise a processed surface comprising one or more features. The bonding interface can be substantially free of voids. The structure is considered substantially free of voids if most or all of the bonding interface is free of voids such that there are no voids that interfere with the electrical performance of the wafer or of most or all of the devices thereon. The bonding interface may be electrically transparent.

This structure may be made by the methods of the invention, but is not limited to such methods. The structure may be two silicon wafers bonded together, but may also comprise more wafers as described above. The structure may comprise a plurality of devices that may be cut apart.

When the bonding surface is a (100) silicon surface, the trenches may be substantially oriented along the <110> direction.

Having described the invention, the following examples are given to illustrate specific applications of the invention. These specific examples are not intended to limit the scope of the invention described in this application.

PRIOR ART EXAMPLE

General Procedure—All of the examples followed the same standard process. The wafers were Si (100) and were hydrophobically bonded. The process flow was as follows:

(1) Wafers were taken from the cassette, inspected, and any dust particles were blown off using a $CO_2$ snow jet.

(2) Wafers were cleaned in an UV/ozone cleaner at a temperature of 150° C. for 20 min.

(3) Wafers were ultrasonically cleaned in SCI ($H_2O_2$:$NH_4OH$:$4H_2O$) for 10 min at 40° C.

(4) Wafers were rinsed in flowing deionized water for 10 min.

(5) Wafers were dipped in dilute HF (1:10 with water) for 30 s to render the surface hydrophobic and spin dried.

(6) Wafers were bonded.

The bond interface was imaged in all cases using the transmission infrared technique. An infrared sensitive charge-coupled device camera was used to record the actual images, and a halogen light source beneath the wafer was used as the infrared source. After bonding, the wafers showed no particle-related voids.

Prior art method—In this example, there were no trenches and there was no pre-bond annealing. After a 400° C. anneal for 5 to 16 hr, thermally generated voids appeared. These voids represented unbonded areas at the bond interface due to the accumulation and expansion of interfacial gases.

Example 1

Figure 2:
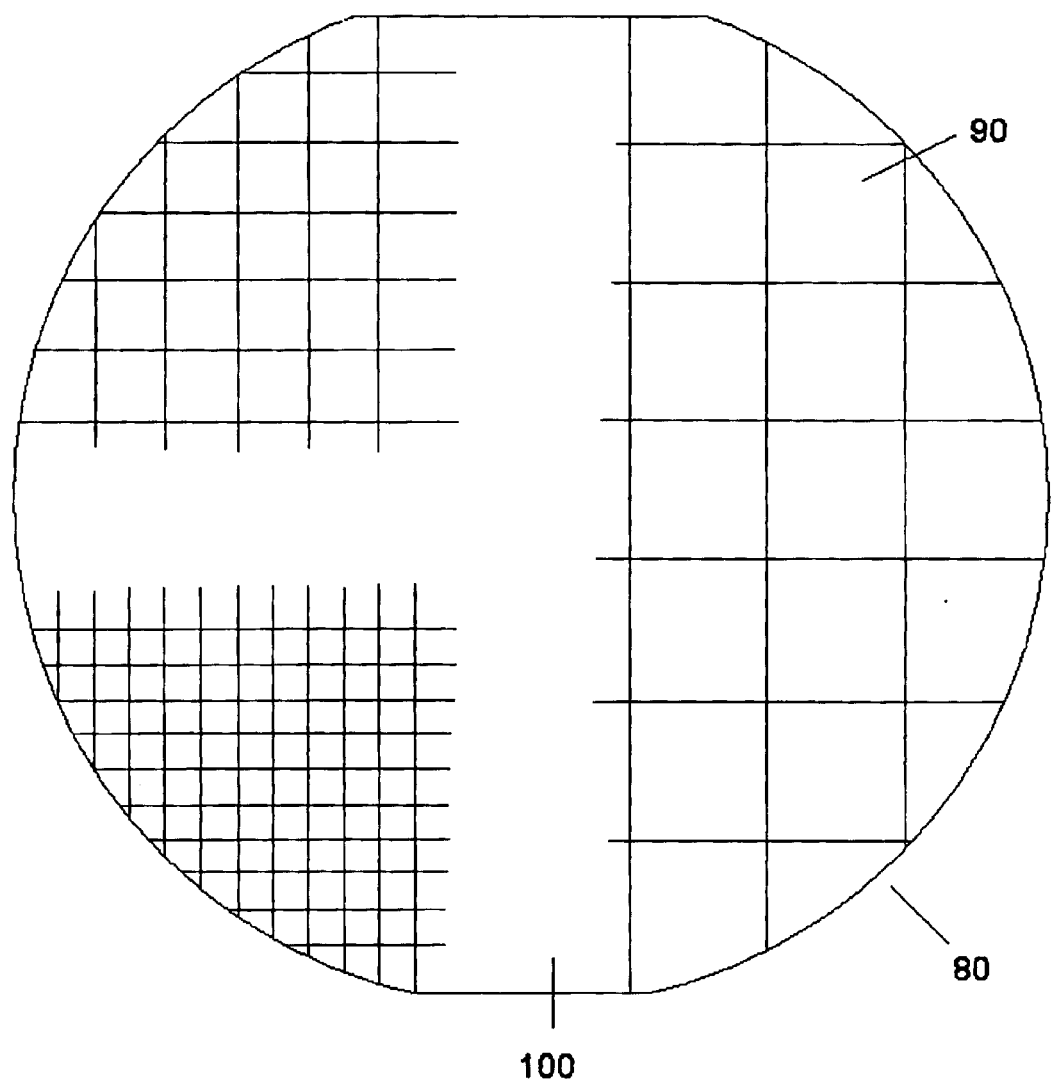
FIG. 2 schematically illustrates the pattern of trenches used in examples 1 and 2.

Trenches perpendicular to preferred diffusion direction—Wafers were prepared by dry etching a grid of trenches into the surface to be bonded. The trenches were 150 $\mu$m wide and 2 $\mu$m deep. The spacing of the grids was 13.500, 6.750, and 3.375 mm. The pattern is schematically illustrated in FIG. 2. The patterning was performed using photolithography and positive photoresist. The etching was done in a barrel etcher. One etched wafer 80 and one non-etched wafer were bonded together. All voids were eliminated with the exception of a few individual voids in the large grid 90. Voids populated the non-grid areas 100. This experiment was repeated three times with the same results of the occasional void appearing in the large grid area 90. The average number of voids per wafer in the large grid areas was 2.33 voids/10 squares. This indicates that 13.5 mm grid spacing may be just above the limit to ensure complete void elimination. Voids in the open areas 100 were not considered a problem because such open areas would typically be in unused parts of the wafers that are not cut into devices.

Example 2

Misaligned trenches—This example was performed using the same kind of grid etched wafer, however, when bonding, the two primary flats of the wafers were intentionally misaligned approximately 45° from each other. The result after annealing at 400° C. for 16 hr indicates a marked increase in the frequency of void occurrence in the large grid areas. The number of voids in the large grid area increased to over 20 voids per 10 squares. This can be explained if the diffusion of gases that form the voids is preferential along the <110> directions. The diffusion length along the <110> directions was increased by a factor of 1.41 while the random direction diffusion length was not changed.

Example 3

Figure 3:
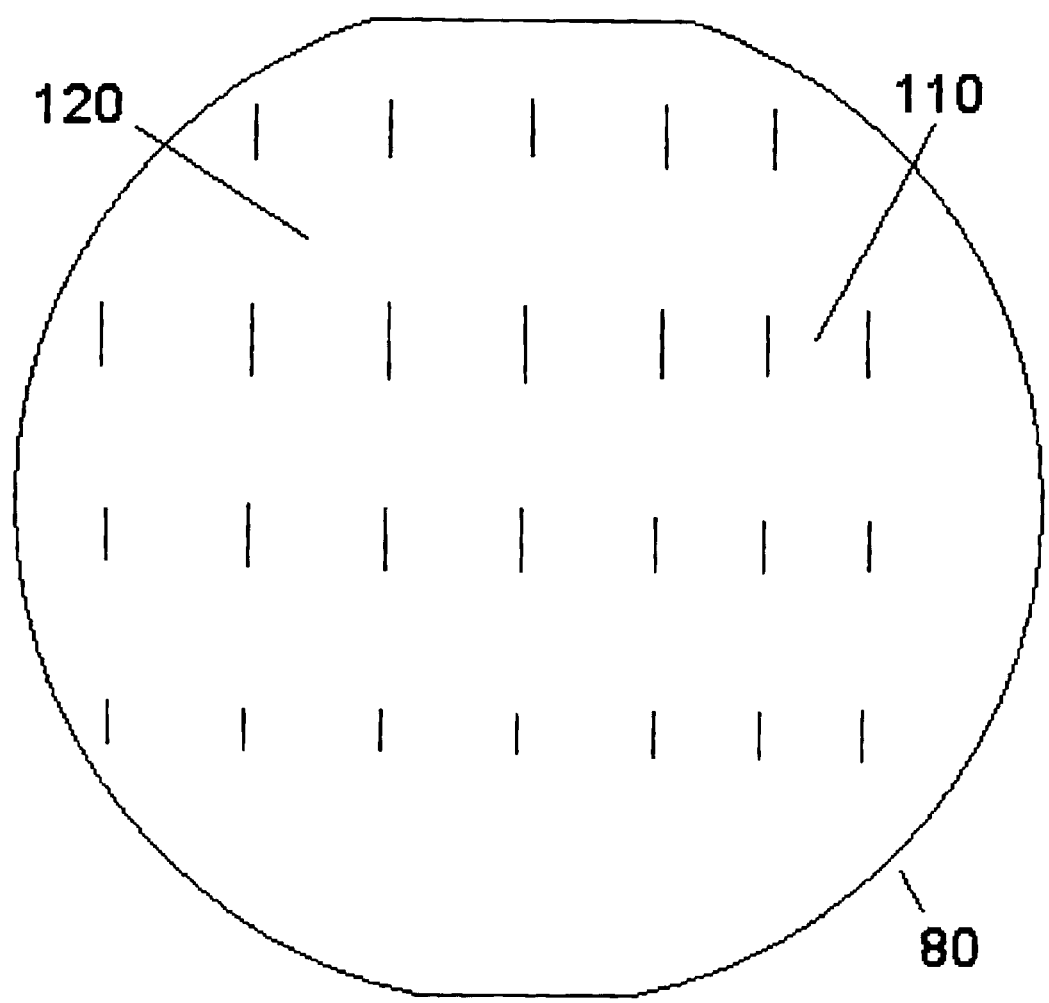
FIG. 3 schematically illustrates the pattern of trenches used in example 3.

Array of trenches—In this example, an array of trenches was etched into the surface of one of the wafers 80. The pattern is schematically illustrated in FIG. 3. The pattern was designed to allow large measurable trench-free areas 120 and provide reservoirs in one direction for the interfacial gases. An etched wafer was bonded to a non-etched wafer using the standard hydrophobic process, and subsequently annealed at 400° C. for 16 hr. The etched lines are aligned perpendicular to the major flat and along a <110> direction. The wafers were split into two regions, one where the space between lines is 13 mm and the other where spacing is 10 mm. A visual inspection of the results indicates a significant reduction of voids between the etched lines 110 with insignificant void reduction in the open areas above and below the etched lines 120.

Void densities in the open areas 120, the areas between the lines 110, and within a radius of the tips of the lines were calculated by counting and locating each void in six individual bonded wafer pairs. These measurements did not differentiate between voids located between the 13-mm spaced trenches and voids located between the 10-mm spaced trenches. The data is reported Table 1, along with the standard deviation information. The void density is lower near the etched lines and increases away from them. As can be seen, the void density approaches the open area density at a distance of approximately 5 mm from the etched line. However, while the void density increases quickly above and below the etched line, the void density increases linearly between the lines. At all times, the void density at a measured radius from the etched line tip is higher than the void density from the same measured distance between the lines.

strength was defined as the strength necessary for the wafer to be successfully diced into 13.5 mm chips. This strength was found empirically to be approximately 175 to 200 ergs/cm$^2$. Table 2 shows the relative range on bond strength measurements of the some of the above examples.

TABLE 2

| Method | Bond Strength (ergs/cm$^2$) | Notes |
| --- | --- | --- |
| Prior art example | 350–450 | Many thermally generated voids |
| Pre-bond anneal (Example 4) | 150–250 | Eliminates thermally generated voids |
| Trenches (Example 1) | 375–450 | Eliminates thermally generated voids (in devices) |

We claim:
1. A semiconductor structure comprising a plurality of wafers;

TABLE 1

| Distance from trench (mm) | Average void density near trench ends (voids/mm$^2$) | Standard deviation | Average void density between trenches (voids/mm$^2$) | Standard deviation | Average void density in open areas (void/mm$^2$) | Standard deviation |
| --- | --- | --- | --- | --- | --- | --- |
| 1.125 | 0.0178 | 0.0142 | 0.0191 | 0.00210 | 0.051664 | 0.00879 |
| 2.5 | 0.0335 | 0.0108 | 0.0187 | 0.0107 | | |
| 3.75 | 0.0400 | 0.0153 | 0.0332 | 0.0137 | | |
| 5 | 0.0449 | 0.0127 | 0.0491 | 0.0123 | | |

Example 4

Pre-bond annealing—Pre-bond annealing without etching trenches shows that pre-bond annealing can also reduce voids. After the wafers were spin dried, they were placed in the UV/Ozone chamber for pre-bond annealing. The UV/Ozone chamber was left at ambient atmosphere, and no gases were allowed to flow. The chamber was selected because of its known cleanliness and convenience to the rest of the processing steps. The anneal temperatures ranged from 200° C. to 300° C., and the anneal time was varied from 5 to 20 min. After bonding, the wafers were annealed for 16 hr at 400° C. The 300° C. pre-bond anneal for ten minutes was most successful at removing voids, and with careful processing, would eliminate all of the thermally generated voids.

Example 5

Bond Strength—In order to make useful devices that utilize the hydrophobic bonding process, they must have sufficient bond strength to withstand subsequent processing, including dicing and packaging. The bond strength may also be a factor in the long-term reliability of the part. The bond strength of the bonded wafers was measured using the standard Maszara method of inserting a razor blade into the bond interface, and measuring the crack length that is caused. The measurement was done on an infrared stage, and the image of the razor at the interface and crack length was digitized. This allowed accurate reproduction of the bond strength measurement. However, due to the fourth power dependence of bond strength on crack length, there was considerable spread in the data. Minimum required bond wherein each wafer comprises a bonding surface;
wherein the bonding surfaces are bonded together by a direct wafer bonding interface; and
wherein one or more bonding surfaces comprise one or more trenches lengthwise aligned substantially perpendicular to a preferred direction of gas diffusion along one or more of the bonding surfaces.

2. The semiconductor structure of claim 1, wherein the bonding surface is a (100) silicon surface and the trenches are substantially oriented along the <110> direction.

3. The semiconductor structure of claim 1, wherein one or more trenches extend to the edge of the wafer.

4. The semiconductor structure of claim 1, wherein the bonding interface is substantially free of voids.

5. The semiconductor structure of claim 1, wherein the bonding interface is electrically transparent.

6. The semiconductor structure of claim 1, wherein the semiconductor structure comprises a plurality of separate circuits that may be cut apart.

7. The semiconductor structure of claim 1, wherein the trenches do not extend through the entire thickness of the wafer on which the trenches are located.

8. The semiconductor structure of claim 1, wherein one or more bonding surfaces comprise one or more trenches substantially perpendicular to a preferred direction of diffusion along all of the bonding surfaces.

9. The semiconductor structure of claim 1, wherein at least one wafer comprises a processed surface opposing the bonding surface comprising one or more a features.

10. The semiconductor structure of claim 9, wherein the features have desired electrical properties.

* * * * *